United States Patent
Chen et al.

(10) Patent No.: US 8,377,781 B2
(45) Date of Patent: Feb. 19, 2013

(54) TRANSISTOR WITH ASYMMETRIC SILICON GERMANIUM SOURCE REGION

(75) Inventors: Jian Chen, Austin, TX (US); James F. Buller, Austin, TX (US); Akif Sultan, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 4 days.

(21) Appl. No.: 13/230,083

(22) Filed: Sep. 12, 2011

(65) Prior Publication Data
US 2012/0003802 A1    Jan. 5, 2012

Related U.S. Application Data

(62) Division of application No. 11/278,618, filed on Apr. 4, 2006, now Pat. No. 8,035,098.

(51) Int. Cl.
*H01L 21/336* (2006.01)

(52) U.S. Cl. .............. 438/285; 438/286; 438/E21.409

(58) Field of Classification Search ............. 438/285, 438/286
See application file for complete search history.

(56) References Cited

U.S. PATENT DOCUMENTS

| 5,578,865 | A  | 11/1996 | Vu et al. |
|-----------|----|---------|-----------|
| 6,207,977 | B1 | 3/2001  | Augusto |
| 6,858,506 | B2 | 2/2005  | Chang |
| 2002/0000622 | A1 | 1/2002 | Yamakawa et al. |
| 2005/0130454 | A1 | 6/2005 | Murthy et al. |
| 2006/0046406 | A1 | 3/2006 | Chindalore et al. |
| 2006/0258072 | A1 | 11/2006 | Kavalieros et al. |
| 2006/0292776 | A1 | 12/2006 | Jin et al. |

*Primary Examiner* — Wael Fahmy
*Assistant Examiner* — Sarah Salerno
(74) *Attorney, Agent, or Firm* — Williams, Morgan & Amerson, P.C.

(57) ABSTRACT

The present invention is directed to a transistor with an asymmetric silicon germanium source region, and various methods of making same. In one illustrative embodiment, the transistor includes a gate electrode formed above a semiconducting substrate comprised of silicon, a doped source region comprising a region of epitaxially grown silicon that is doped with germanium formed in the semiconducting substrate and a doped drain region formed in the semiconducting substrate.

9 Claims, 4 Drawing Sheets

TRANSISTOR WITH ASYMMETRIC SILICON GERMANIUM SOURCE REGION

CROSS-REFERENCE TO RELATED APPLICATION

This is a divisional of application Ser. No. 11/278,618, filed Apr. 4, 2006 now U.S. Pat. No. 8,035,098.

BACKGROUND OF THE INVENTION

1. Field of the Invention

The present invention is generally directed to the field of integrated circuit devices, and, more particularly, to a transistor with an asymmetric silicon germanium source region, and various methods of making same.

2. Description of the Related Art

The manufacturing of semiconductor devices may involve many process steps. For example, semiconductor fabrication typically involves processes such as deposition processes, etching processes, thermal growth processes, various heat treatment processes, ion implantation, photolithography, etc. Such processes may be performed in any of a variety of different combinations to produce semiconductor devices that are useful in a wide variety of applications.

In general, there is a constant drive within the semiconductor industry to increase the operating speed and efficiency of various integrated circuit devices, e.g., microprocessors, memory devices, and the like. This drive is fueled by consumer demands for computers and electronic devices that operate at increasingly greater speeds and efficiency. This demand for increased speed and efficiency has resulted in a continual reduction in the size of semiconductor devices, e.g., transistors, as well as the packing density of such devices on an integrated circuit device. That is, many components of a typical field effect transistor (FET), e.g., channel length, junction depths, gate insulation thickness, and the like, are reduced. For example, all other things being equal, the smaller the channel length of the transistor or the thinner the gate insulation layer, the faster the transistor will operate. Thus, there is a constant drive to reduce the size, or scale, of the components of a typical transistor to increase the overall speed of the transistor, as well as integrated circuit devices incorporating such transistors.

Modern field effect transistors comprise a gate electrode, a gate insulation layer, a source region and a drain region. When an appropriate voltage is applied to the gate electrode, a channel region is formed between the source region and the drain region and electrons (or holes) flow between the source region and drain region. The source and drain regions of such transistors are normally the same. For example, for an NMOS transistor, both the source and drain regions are formed by introducing an N-type dopant material, e.g., arsenic, into the semiconductor material. For a PMOS transistor, the source and drain regions are formed by introducing a P-type dopant material, e.g., boron, into the semiconductor material. In some cases, there may be a difference in the dopant concentration of the source and drain regions.

Such transistors with symmetric source and drain regions are sufficient for many applications, as evidenced by their widespread use within the industry. However, in some applications, it may be desirable to make transistors that depart from this traditional structure to enhance the performance of the device.

The present invention is directed to various methods and systems that may solve, or at least reduce, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a transistor with an asymmetric silicon germanium source region, and various methods of making same. In one illustrative embodiment, the transistor includes a gate electrode formed above a semiconducting substrate comprised of silicon, a doped source region comprising a region of epitaxially grown silicon that is doped with germanium formed in the semiconducting substrate and a doped drain region formed in the semiconducting substrate.

In another illustrative embodiment, the transistor comprises a gate electrode formed above a semiconducting substrate comprised of silicon, a doped source region comprising a region of epitaxially grown silicon that comprises approximately 10-25% germanium formed in the semiconducting substrate and a doped drain region formed in the semiconducting substrate.

In one illustrative embodiment, the method comprises forming a gate electrode above a semiconducting substrate, etching a trench into the semiconducting substrate between one side of the gate electrode and an isolation structure, forming a silicon germanium structure in the trench and forming a doped source region and a doped drain region, the doped source region being formed at least partially in the silicon germanium structure, the doped drain region being formed in the semiconducting substrate.

In another illustrative embodiment, the method comprises forming a gate electrode above a semiconducting substrate, etching a trench into the semiconducting substrate between one side of the gate electrode and an isolation structure, epitaxially growing a layer of silicon in the trench while introducing germanium during the epitaxial growth process to thereby form a silicon germanium structure in the trench, and forming a doped source region and a doped drain region, the doped source region being formed at least partially in the silicon germanium structure, the doped drain region being formed in the semiconducting substrate.

BRIEF DESCRIPTION OF THE DRAWINGS

The invention may be understood by reference to the following description taken in conjunction with the accompanying drawings, in which like reference numerals identify like elements, and in which.

Figure 1:
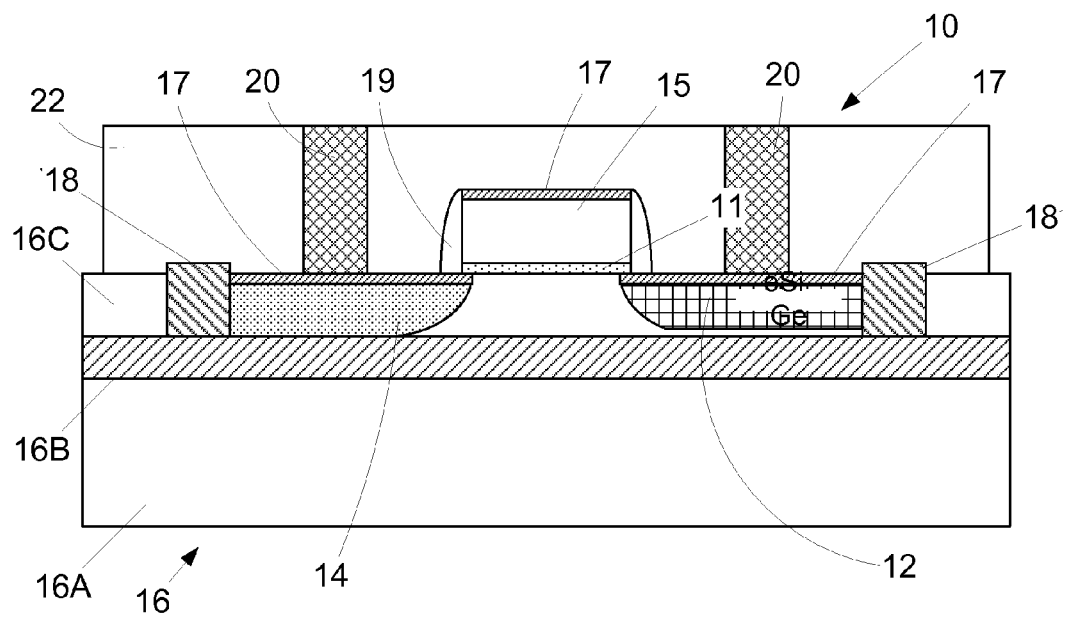
FIG. 1 is a cross-sectional side view of an illustrative embodiment of a transistor in accordance with one aspect of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures and regions are schematically depicted in the drawings for purposes of explanation only and so as to not obscure the present invention with details that are well known to those skilled in the art. The relative sizes of the various structures and regions depicted in the drawings may be exaggerated for purposes of explanation. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 depicts one illustrative embodiment of the transistor 10 disclosed herein. As shown therein, the transistor 10 comprises a gate insulation layer 11, a gate electrode 15, at least one sidewall spacer 19, a source region 12 and a drain region 14. In the illustrative embodiment depicted in FIG. 1, the transistor 10 is formed in a silicon-on-insulator (SOI) substrate 16 comprised of a bulk substrate 16A, a buried insulation layer 16B (sometimes referred to as a "buried oxide layer" or "BOX" layer), and an active layer 16C. A trench isolation structure 18 may be employed to electrically isolate the transistor 10 from other semiconductor devices. Also depicted in FIG. 1 are illustrative metal silicide regions 17 and illustrative conductive contacts 20 that are positioned in a layer of insulating material 22. The conductive contacts 20 are conductively coupled to the source region 12 and the drain region 14, as depicted in FIG. 1. A conductive contact is also formed to the gate electrode 15, although that conductive contact is not depicted in FIG. 1.

The gate insulation layer 11, the gate electrode 15, the sidewall spacers 19, and the metal silicide regions 17 may all be formed using known techniques and materials. For example, the gate insulation layer 11 may be a thermally grown layer of silicon dioxide. The gate electrode 15 may be a doped layer of polysilicon that is formed by traditional deposition, doping and etching processes. Similarly, the sidewall spacer 19 may comprise a material such as, for example, silicon nitride, and it may be formed by conformally depositing a layer of spacer material and performing an anisotropic etching process. The metal silicide regions 17 may be comprised of, for example, cobalt silicide, and they may be formed using traditional techniques.

In one illustrative embodiment, the source region 12 of the transistor 10 is comprised of an epitaxially grown layer of silicon having a concentration of germanium ranging from approximately 10-25%. The germanium may be introduced into the layer of epitaxially grown silicon by performing an in situ doping process that is performed as the layer of epitaxial silicon is grown. After a complete reading of the present application, those skilled in the art will appreciate that the present invention has broad application. For example, the present invention may be employed in connection with the formation of NMOS or PMOS transistors. For convenience, the present invention will be disclosed in the context where an illustrative NMOS transistor 10 is formed. However, the present invention is not limited to the formation of such illustrative devices.

Figure 2:
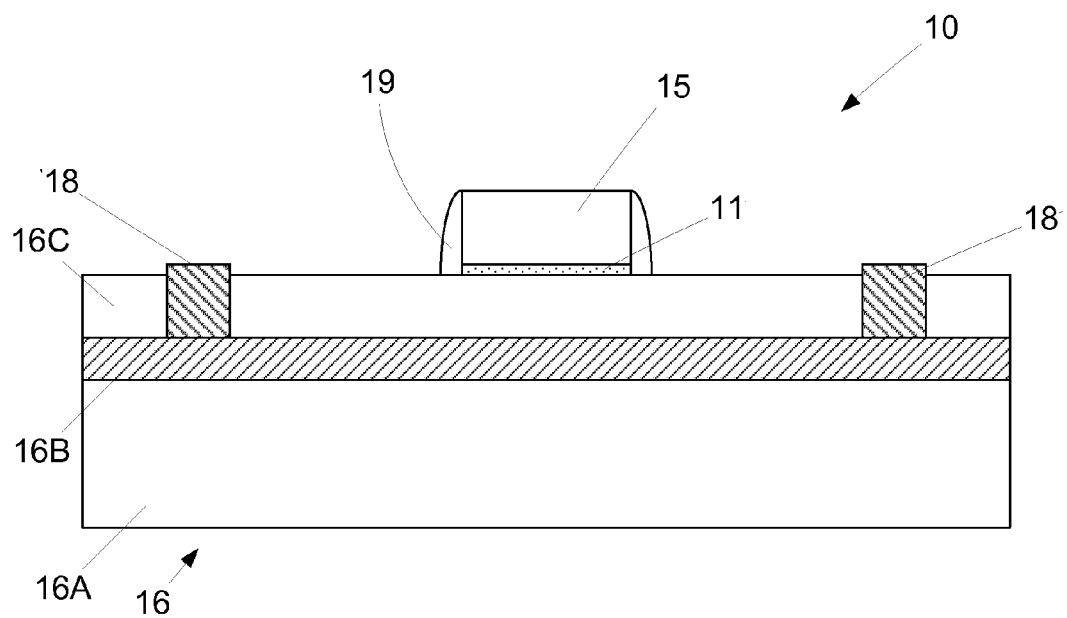
FIG. 2 is a cross-sectional side view depicting an early stage of manufacture of an illustrative transistor in accordance with one illustrative embodiment of the present invention.

FIGS. 2-7 depict one illustrative process flow for forming the illustrative transistor 10 depicted herein. As shown in FIG. 2, the isolation region 18 may be formed in the active layer 16C by performing known etching and deposition techniques. FIG. 2 depicts the transistor 10 at the point of manufacture wherein the gate insulation layer 11 and the gate electrode 15 have been formed in accordance with known techniques. The sidewall spacer 19 may be comprised of a variety of materials and may be formed using a variety of known techniques. For example, the spacer 19 may be formed by conformally depositing a layer of spacer material, e.g., silicon dioxide, silicon nitride, and thereafter performing an anisotropic etching process. In one illustrative process flow, the sidewall spacer 19 is employed to protect the gate electrode 11 during a subsequent etching process performed in forming the source region 12, as described more fully below. The sidewall spacer 19 may be sacrificial or permanent as described more fully below.

Figure 3:
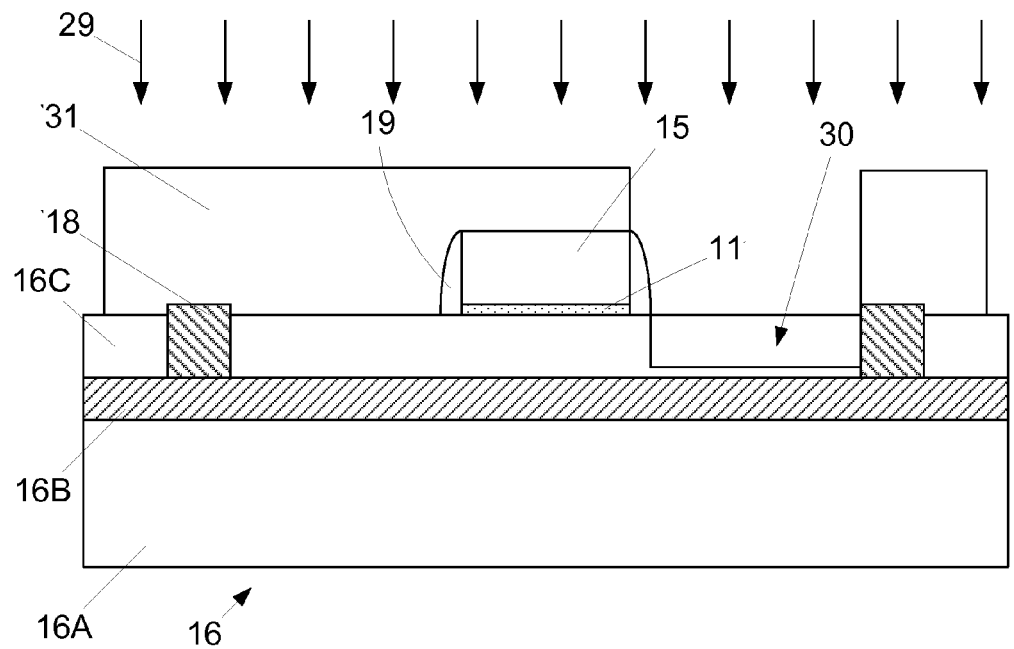
FIG. 3 is a view of the device depicted in FIG. 2 having a trench formed therein for the source region of the illustrative transistor depicted herein.

FIG. 3 depicts the device shown in FIG. 2 after an etching process 29 is performed to form a trench 30 in the active layer 16C between the isolation structure 18 and the sidewall spacer 19. In some cases, the spacer 19 may or may not be present. Thus, when it is stated that the trench 30 is formed between the isolation structure 18 and the gate electrode 15, it is to be understood that the gate electrode structure may or may not have the spacer 19 formed adjacent thereto. A masking layer 31, e.g., photoresist, is employed during the etching process 29 to protect the remainder of the substrate 16. The sidewall spacer 19 protects the gate electrode 11 during the etching process 29. In the particular embodiment depicted herein, the trench 30 is self-aligned with respect to the sidewall spacer 19. In one illustrative embodiment, the trench 30 does not extend all the way to the buried insulation layer 16B so that the remaining portions of the active layer 16C in the trench 30 can serve as a seed layer for the subsequent epitaxial growth of silicon in the trench 30, as described more fully below. In some cases, the trench 30 may have a depth or thickness of approximately 200-800 Å.

Figure 4:
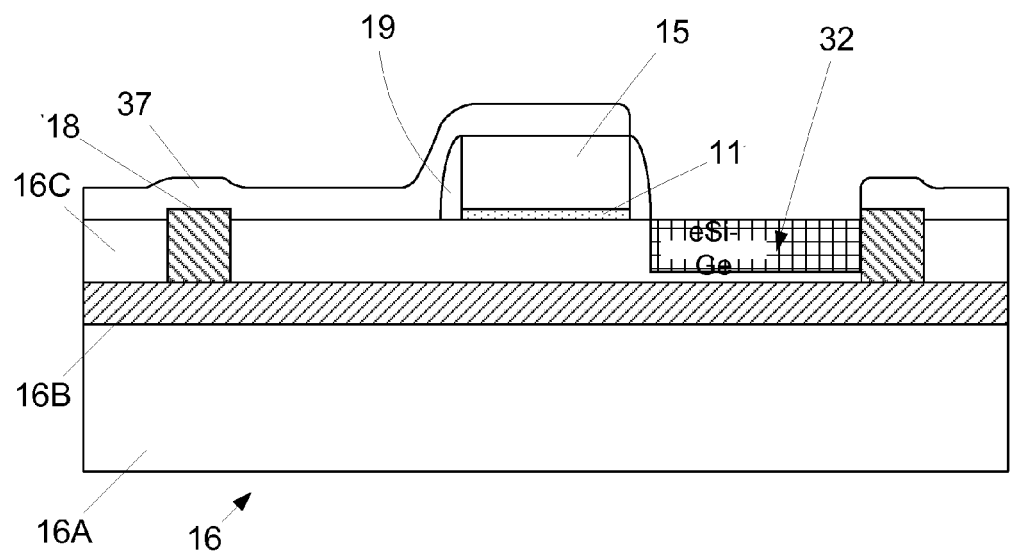
FIG. 4 is a view of the device depicted in FIG. 3 after a layer of epitaxially grown silicon is formed in the trench for the source region.

Next, as shown in FIG. 4, in one illustrative embodiment, a layer of germanium-doped epitaxial silicon 32 ("eSi-Ge") is grown in the trench 30. The epitaxial silicon 32 may be grown using known processing techniques and known epi-deposition tools. A hard mask layer 37 is formed above the substrate 16 during the epitaxial growth process. The hard mask material may be comprised of the same materials as the spacer 19. The material selected for the hard mask layer 37 must be able to withstand the processing conditions during the growth of the epitaxial layer of silicon 32 and still perform the necessary masking function.

In accordance with one aspect of the present invention, germanium is introduced into the epitaxial layer of silicon 32 by introducing germanium during the epitaxial growth process. The concentration of the germanium may vary depending upon the particular application. For example, the concentration of germanium in the final source region 12 may comprise approximately 10-25%. The germanium in the layer 32 may act to reduce the effective bandgap of the silicon, thereby improving device performance.

Figure 5:
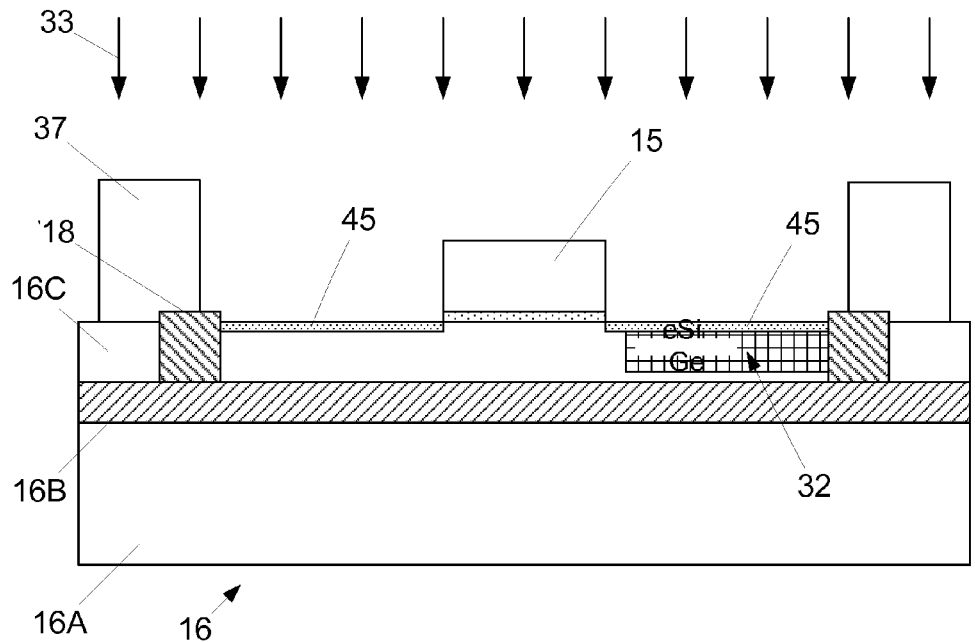
FIG. 5 is a view of the device depicted in FIG. 4 wherein dopant materials are implanted to form the LDD regions on the source and drain regions of the illustrative transistor depicted herein.
Figure 6:
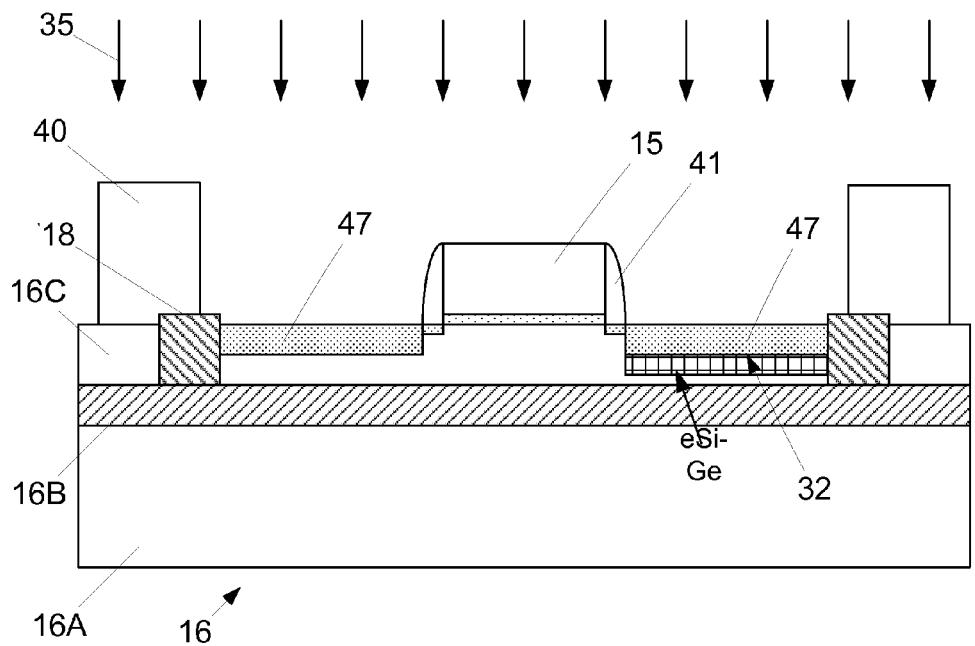
FIG. 6 is a view of the device depicted in FIG. 5 wherein a source/drain implant procedure is performed to form the source and drain regions of the illustrative transistor depicted herein.

After the silicon-germanium epitaxial layer of silicon is formed, standard processing techniques are employed to complete the manufacture of the transistor 10, e.g., LDD and source/drain implants may be performed to complete the formation of the source region 12 and drain region 14 of the transistor 10. As shown in FIG. 5, a new masking layer 37 may be formed above the substrate 16 and thereby exposes the area where the source region 12 and drain region 14 are to be formed. An LDD ion implant process 33 is performed to introduce an N-type dopant material, e.g., arsenic, into the silicon germanium layer 32 and the portion 42 of the active layer 16C wherein the drain region 14 will be formed. This LDD implant 33 results in the formation of LDD regions 45 that are self-aligned with respect to the gate electrode 15. Illustrative N-type dopant materials that are introduced in the LDD implant process 33 include, for example, arsenic, phosphorus, etc. The LDD implant process 33 may be performed at a dopant dose and an energy level appropriate for the device under construction. Next, as shown in FIG. 6, a so-called source/drain ion implant process 35 is performed to introduce a relatively high concentration of an N-type dopant material, such as, e.g., arsenic or phosphorous, at a dopant dose and energy level sufficient for the intended application. In the embodiment shown in FIG. 6, a new spacer 41 has been added prior to performing the source/drain implant process 35.

Prior to performing the LDD implant process 33, the spacer 19 may or may not be removed. If it is removed, at least one new spacer (not shown) may be formed adjacent the gate electrode 15. For example, such a spacer may be employed prior to performing the LDD implant 33 on a PMOS transistor. It should be understood that one or more spacers may be formed prior to or during the various ion implant processes performed to form the source region 12 and the drain region 14.

Figure 7:
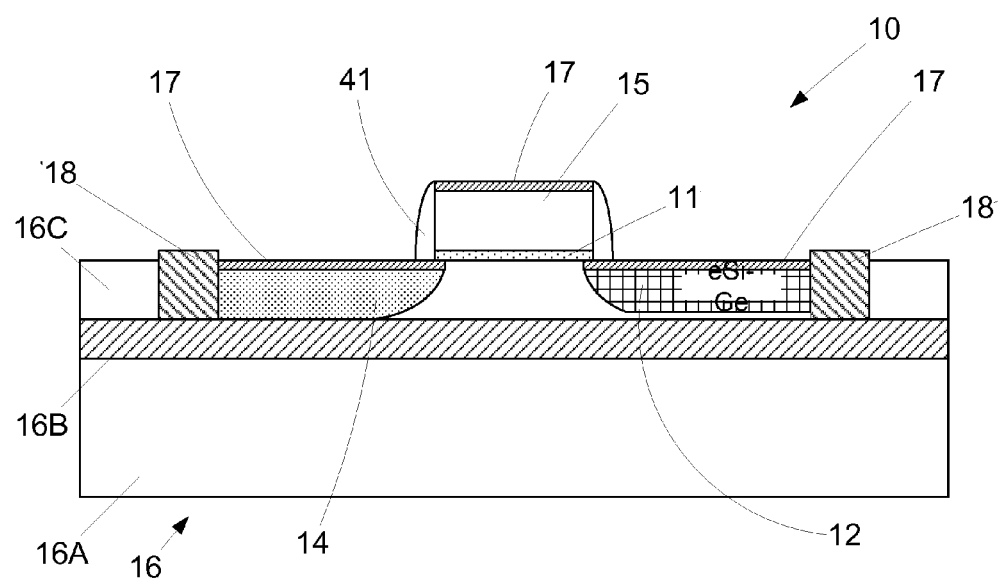
FIG. 7 is an illustrative cross-sectional view of the transistor described herein.

Thereafter, known processing techniques may be employed to complete the formation of the transistor 10, as shown in FIG. 7. For example, one or more heat treatment processes may be performed to activate the implanted dopant material and repair any damage to the lattice structure. If desired, metal silicide regions 17 may be formed on the source region 12, the drain region 14 and the gate electrode 15 as shown in FIG. 1 using known techniques. It should be noted that the transistor depicted in FIG. 8 is depicted after various heat treatments have been performed to thereby cause the implanted dopant material to migrate somewhat under the gate electrode 15.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
    forming a gate electrode above a semiconducting substrate;
    etching a trench into said semiconducting substrate between one side of said gate electrode and an isolation structure;
    forming a silicon germanium structure in said trench; and
    forming a doped source region and a doped drain region, said doped source region being formed at least partially in said silicon germanium structure, said doped drain region being formed in a region of said semiconducting substrate not doped with germanium, wherein said doped source region and said doped drain region have the same conductivity type and are asymmetric with respect to said region of epitaxially grown silicon-germanium.

2. The method of claim 1, further comprising forming a conductive contact to each of said source region, said drain region and said gate electrode.

3. The method of claim 1, further comprising forming a metal silicide layer on each of said source region, said drain region and said gate electrode.

4. The method of claim 1, wherein forming a silicon germanium structure in said trench comprises epitaxially growing a layer of silicon while introducing germanium.

5. The method of claim 1, wherein forming a silicon germanium structure in said trench comprises forming a silicon germanium structure comprising approximately 10-25% germanium in said trench.

6. The method of claim 1, wherein said semiconducting substrate is an SOI substrate and said transistor is formed in an active layer of said SOI substrate.

7. The method of claim 1, wherein said semiconducting substrate is a bulk silicon substrate.

8. A method of forming a transistor, comprising:
    forming a gate electrode above a semiconducting substrate;
    etching a trench into said semiconducting substrate between one side of said gate electrode and an isolation structure;
    epitaxially growing a layer of silicon in said trench while introducing germanium during said epitaxial growth process to thereby form a silicon germanium structure in said trench; and
    forming a doped source region and a doped drain region, said doped source region being formed at least partially in said silicon germanium structure, said doped drain region being formed in a region of said semiconducting substrate not doped with germanium, wherein said doped source region and said doped drain region have the same conductivity type and are asymmetric with respect to said region of epitaxially grown silicon-germanium.

9. The method of claim 8, wherein said silicon germanium structure comprises approximately 10-25% germanium.

* * * * *